(12) United States Patent
Masleid

(10) Patent No.: US 7,498,846 B1
(45) Date of Patent: Mar. 3, 2009

(54) POWER EFFICIENT MULTIPLEXER

(75) Inventor: Robert Paul Masleid, Monte Sereno, CA (US)

(73) Assignee: Transmeta Corporation, Santa Clara, CA (US)

( * ) Notice: Subject to any disclaimer, the term of this patent is extended or adjusted under 35 U.S.C. 154(b) by 94 days.

(21) Appl. No.: 11/021,632

(22) Filed: Dec. 23, 2004

Related U.S. Application Data

(63) Continuation-in-part of application No. 10/864,271, filed on Jun. 8, 2004, now Pat. No. 7,336,103.

(51) Int. Cl.
H03K 19/094 (2006.01)
H03K 19/20 (2006.01)

(52) U.S. Cl. .......................... 326/113; 326/119; 327/408

(58) Field of Classification Search .................. 326/113, 326/119, 121, 122, 83; 327/415, 416, 407–410
See application file for complete search history.

(56) References Cited

U.S. PATENT DOCUMENTS

| 4,498,021 | A | 2/1985 | Uya |
| 4,700,089 | A | 10/1987 | Fujii et al. |
| 4,760,279 | A | 7/1988 | Saito et al. |
| 5,039,893 | A | 8/1991 | Tomisawa |
| 5,166,555 | A | 11/1992 | Kano |
| 5,227,679 | A | 7/1993 | Woo |
| 5,414,312 | A | 5/1995 | Wong |
| 5,455,521 | A | 10/1995 | Dobbelaere |
| 5,497,105 | A | 3/1996 | Oh et al. |
| 5,587,665 | A | 12/1996 | Jiang |
| 5,698,994 | A | 12/1997 | Tsuji |
| 5,739,715 | A | 4/1998 | Rawson |
| 5,767,700 | A | 6/1998 | Lee |
| 5,777,501 | A | 7/1998 | AbouSeido |
| 5,778,214 | A | 7/1998 | Taya et al. |
| 5,791,715 | A | 8/1998 | Nebel |
| 5,797,105 | A | 8/1998 | Nakaya et al. |
| 5,963,074 | A | 10/1999 | Arkin |
| 5,969,543 | A | 10/1999 | Erickson et al. |
| 6,025,738 | A | 2/2000 | Masleid |
| 6,069,506 | A | 5/2000 | Miller et al. |
| 6,111,447 | A * | 8/2000 | Ternullo, Jr. ................. 327/292 |

(Continued)

FOREIGN PATENT DOCUMENTS

| JP | 03089624 A | 4/1991 |
| JP | 04091516 A | 3/1992 |
| JP | 6216723 | 8/1994 |

OTHER PUBLICATIONS

Nalamalpu, et al., Boosters for Driving Long Onchip Interconnects-Design Issues, Interconnect Synthesis, and Comparison With Repeaters, Jan. 2002, IEEE Transactions on Computer-Aided Design of Integrated Circuits and Systems, vol. 21, No. 1, pp. 50-62.

(Continued)

Primary Examiner—Daniel D Chang

(57) ABSTRACT

A power efficient multiplexer. In accordance with a first embodiment of the present invention, a power efficient multiplexer comprises a transmission gate structure for selectively passing one of a plurality of input signals and a stacked inverter circuit for inverting the one of a plurality of input signals. Both the stacked inverter and the transmission gate provide beneficial reductions in static power consumption in comparison to conventional multiplexer designs.

18 Claims, 2 Drawing Sheets

U.S. PATENT DOCUMENTS

| | | | |
|---|---|---|---|
| 6,114,840 A | 9/2000 | Farrell et al. | |
| 6,160,755 A | 12/2000 | Norman et al. | |
| 6,172,545 B1 * | 1/2001 | Ishii | 327/276 |
| 6,198,334 B1 | 3/2001 | Tomobe et al. | |
| 6,204,710 B1 | 3/2001 | Goetting et al. | |
| 6,262,601 B1 | 7/2001 | Choe et al. | |
| 6,275,091 B1 | 8/2001 | Saeki | |
| 6,285,230 B1 | 9/2001 | Na | |
| 6,294,930 B1 * | 9/2001 | Goetting et al. | 326/44 |
| 6,321,282 B1 | 11/2001 | Horowitz et al. | |
| 6,459,319 B2 | 10/2002 | Sako | |
| 6,573,777 B2 | 6/2003 | Saint-Laurent et al. | |
| 6,577,176 B1 | 6/2003 | Masleid et al. | |
| 6,731,140 B2 | 5/2004 | Masleid et al. | |
| 6,762,638 B2 * | 7/2004 | Correale et al. | 327/202 |
| 6,879,200 B2 | 4/2005 | Komura et al. | |
| 7,271,638 B2 | 9/2007 | Takai et al. | |
| 2001/0000426 A1 | 4/2001 | Sung et al. | |
| 2001/0030561 A1 | 10/2001 | Asano et al. | |
| 2002/0056016 A1 | 5/2002 | Horowitz et al. | |
| 2003/0042960 A1 | 3/2003 | Gomm | |
| 2003/0057775 A1 | 3/2003 | Yamashita et al. | |
| 2003/0160630 A1 | 8/2003 | Earle | |
| 2003/0231713 A1 | 12/2003 | Masleid et al. | |
| 2004/0124900 A1 | 7/2004 | Brox | |

OTHER PUBLICATIONS

Lima T et al., "Capacitance Coupling Immune, Transient Sensitive Accelerator for resistive Interconnect Signals of Subquater Micron ULSI" IEEE Journal of Solid-State Circuits, IEEE Inc. New York, US pp. 531-536 Apr. 1996.

Taub et al., Digital Integrated Electronics, 1977, McGraw-Hill, Inc., pp. 98-100.

* cited by examiner

POWER EFFICIENT MULTIPLEXER

RELATED APPLICATIONS

This application is a Continuation-in-Part of commonly owned U.S. patent application Ser. No. 10/864,271, filed Jun. 8, 2004 now U.S. Pat. No. 7,336,103, entitled "Stacked Inverter Delay Chain" to Masleid and Burr, which is hereby incorporated herein by reference in its entirety.

This Application is related to the following co-pending, commonly assigned United States Patent Applications, which are hereby incorporated herein by reference in their entirety:

U.S. patent application Ser. No. 11/021,222, filed Dec. 23, 2004, entitled "A Configurable Tapered Delay Chain with Multiple Sizes of Delay Elements" by Masleid;

U.S. patent application Ser. No. 11/021,221, filed Dec. 23, 2004, entitled "A Configurable Delay Chain with Switching Control for Tail Delay Elements" by Masleid;

U.S. patent application Ser. No. 11/021,197, filed Dec. 23, 2004, now U.S. Pat. No. 7,332,931, entitled "Leakage Efficient Anti-glitch Filter with Variable Delay Stages" by Masleid;

U.S. patent application Ser. No. 11/020,746, filed Dec. 23, 2004, now U.S. Pat. No. 7,310,008, entitled "A Configurable Delay Chain with Stacked Inverter Delay Elements" by Masleid; and U.S. patent application Ser. No. 11/021,633, filed Dec. 23, 2004, now U.S. Pat. No. 7,330,054, entitled "Leakage Efficient Anti-glitch Filter" by Masleid.

FIELD OF THE INVENTION

Embodiments in accordance with the present invention relate to power efficient multiplexers.

BACKGROUND

Static power consumption in modern semiconductor processes, e.g., processes with a minimum feature size of about 0.13 microns and smaller, is no longer a negligible component of total power consumption. For such processes, static power may be one-half of total power consumption. Further, static power, as a percentage of total power, is tending to increase with successive generations of semiconductor process. Consequently, circuit elements that are efficient in terms of static power consumption are highly desired. One commonly utilized circuit element is a multiplexer. In general, a multiplexer selects among several inputs to propagate to its output. For example, variable delay circuits generally require a series of multiplexers to select between a signal present at a desired tap of the delay circuit and a signal propagating from beyond a desired tap.

SUMMARY OF THE INVENTION

A power efficient multiplexer is disclosed. In accordance with a first embodiment of the present invention, a power efficient multiplexer comprises a transmission gate structure for selectively passing one of a plurality of input signals and a stacked inverter circuit for inverting the one of a plurality of input signals.

In accordance with another embodiment of the present invention, the plurality of electronic signals is accessed. A method of selecting one electronic signal from a plurality of electronic signals is disclosed. A plurality of transmission gates is configured to select one electronic signal from the plurality of electronic signals. The one electronic signal is inverted utilizing a stacked inverter circuit In accordance with still another embodiment of the present invention, an electronic circuit comprises a stacked inverter circuit. The stacked inverter circuit comprises at least two devices of a first type coupled in series. These devices are coupled in series to a group of at least two devices of an opposite type coupled in series. The electronic circuit further comprises a first conductance terminal of a first transmission gate coupled to a first electronic signal and a first conductance terminal of a second transmission gate coupled to a second electronic signal. The second conductance terminals of the first and second transmission gates are coupled to an input of the stacked inverter circuit. The first control terminal of a semiconductor type of the first transmission gate is coupled to a second control terminal of opposite semiconductor type of the second transmission gate. The second control terminal of the opposite semiconductor type of the first transmission gate is coupled to a first control terminal of the semiconductor type of the second transmission gate.

DETAILED DESCRIPTION OF THE INVENTION

In the following detailed description of the present invention, power efficient multiplexer, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Power Efficient Multiplexer

Embodiments in accordance with the present invention are described in the context of design and operation of integrated semiconductors. More particularly, embodiments of the present invention relate to power efficient multiplexers. It is appreciated, however, that elements of the present invention may be utilized in other areas of semiconductor design and operation.

The following description of embodiments in accordance with the present invention is directed toward pFETs (or p-type metal oxide semiconductor field effect transistors (MOSFETS)) formed in surface N-wells and/or nFETs (or n-type MOSFETS) formed in surface P-wells when a p-type substrate and an N-well process are utilized. It is to be appreciated, however, that embodiments in accordance with the present invention are equally applicable to nFETs (or n-type MOSFETS) formed in surface P-wells and/or pFETs (or p-type MOSFETS) formed in surface N-wells when an n-type substrate and a P-well process are utilized. Consequently, embodiments in accordance with the present invention are well suited to semiconductors formed in both p-type and n-type materials, and such embodiments are considered within the scope of the present invention.

Figure 1:
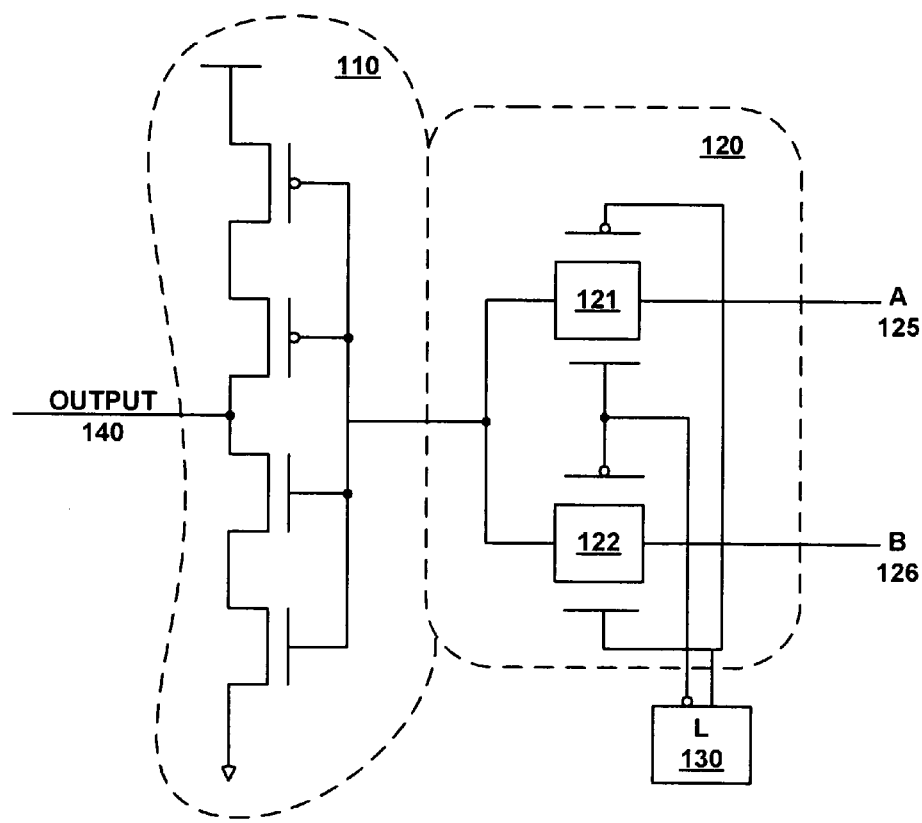
FIG. 1 illustrates a schematic of a novel power efficient multiplexer, in accordance with embodiments of the present invention.

FIG. 1 illustrates a schematic of a novel power efficient multiplexer 100, in accordance with embodiments of the present invention. Power efficient multiplexer 100 comprises an inverter 110 and a transmission gate structure 120. Transmission gate structure 120 comprises transmission gates 121 and 122.

A bit value in latch 130 determines whether transmission gate 121 is "open" or "closed," for example whether transmission gate 121 passes a signal or not. Similarly, the bit value in latch 130 determines whether transmission gate 122 passes a signal or not. Both transmission gates 121 and 122 are controlled by the same bit value and that bit value's complement. Consequently, either transmission gate 122 will pass a signal, or transmission gate 121 will pass a signal, but not both simultaneously.

For example, in the embodiment of FIG. 1, a zero value in latch 130 will cause transmission gate 121 to pass signal A 125, while causing transmission gate 122 not to pass any signals. Consequently, transmission gate structure 120 will select signal A 125 corresponding to a zero value in latch 130.

Similarly, a one value in latch 130 will cause transmission gate 122 to pass signal B 126, while causing transmission gate 121 not to pass any signals. Consequently, transmission gate structure 120 will select signal B 126 corresponding to a one value in latch 130.

The signal, A 125 or B 126, selected by transmission gate structure 120 is inverted by inverter 110 to produce output 140 of power efficient multiplexer 100.

It is to be appreciated that static power consumption in modern semiconductor processes, e.g., processes with a minimum feature size of about 0.13 microns and smaller, is no longer a negligible component of total power consumption. For such processes, static power may be one-half of total power consumption. Further, static power, as a percentage of total power, is tending to increase with successive generations of semiconductor process.

Advantageously, inverter 110 comprises stacked field effect transistors (FETs). In general, an inverter stage, whether conventional or stacked, forms a leakage path, e.g., a series "string" of devices coupled from operating voltage (Vdd) to ground. As current leaks through such leakage paths, static power is consumed by the inverter stage. As described more completely in U.S. patent application Ser. No. 10/864, 271, entitled "Stacked Inverter Delay Chain" to Masleid and Burr, incorporated herein by reference in its entirety, an inverter comprising stacked field effect transistors can consume less static power than a conventional inverter to produce a comparable delay.

Further, such leakage paths within a stacked inverter suffer less leakage than a conventional inverter, yielding additional beneficial leakage reductions. In a conventional inverter, exactly one transistor is on while the other transistor is off. As an unfortunate consequence, approximately the full bias voltage is applied to the off transistor, resulting in a maximum possible leakage for the off transistor.

In contrast, in a stacked inverter multiple transistors are either on or off in series. For example, in the embodiment of FIG. 1, for a "high" state, two transistors are on, while two transistors are off. Consequently, each "off" transistor has significantly less than full bias voltage applied. It is appreciated that leakage current generally decreases exponentially as voltage decreases. For example, a factor of two reduction in off bias voltage produces about a factor of eight reduction in leakage current per leakage path.

It is to be further appreciated that such leakage induces non zero voltages at intermediate nodes between the off transistors. Such voltages induce body effects in the transistors. Such body effects increase the threshold voltage of the affected transistors. An increased threshold voltage generally produces beneficial decreases in leakage current.

Consequently, in addition to a decrease in a number of leakage paths, in accordance with embodiments of the present invention, the leakage current of each path is very beneficially reduced due to an induced body effect and a highly non-linear relationship between bias voltage and leakage current. Thus; inverter 110 significantly reduces static power consumption, in comparison to a conventional inverter.

It is to be appreciated that more or fewer stacked FETs can be can be included in inverter 110 in order to achieve differing signal propagation and/or power characteristics, in accordance with embodiments of the present invention.

For example, physical differences between electrons and holes, and between n-type and p-type dopants, as well as constructive differences in device geometry and dopant placement, result in differences in efficiency between n-type devices and p-type devices. Because electron mobility is higher than hole mobility, n-type devices are more efficient than p-type devices. However, the degree of difference depends on constructive differences that can vary with process. Such physical and constructive differences also produce other behavior differences, such as a difference in sensitivity to body effects. Consequently, different levels of benefit, e.g., in leakage reduction, are to be expected between stacks of n-type devices and stacks of p-type devices. To allow for such effects, in accordance with embodiments of the present invention, it is possible to stack different numbers of transistors on either or both legs of a stacked inverter. Such variations allow increases in load and/or decreases in drive capability, enabling a wide variety of loading and drive characteristics, as well as enabling differing body effects.

Also of benefit in reducing power consumption, particularly static power consumption, of power efficient multiplexer 100 is transmission gate structure 120. It is to be appreciated that transmission gates, for example transmission gates 121 and 122, are characterized as having no direct path between power (Vdd) and ground. Consequently, transmission gates are characterized as having extremely small leakage, and thus very little static power consumption.

It is appreciated that a variety of factors, e.g., operating voltage, operating temperature and/or manufacturing process variations, can affect the speed of operation of an integrated circuit. It is generally desirable for a multiplexer to track speed changes of other circuitry of an integrated circuit. For example, if other circuits of an integrated circuit operate faster, generally a multiplexer is required to select a desired signal more quickly in order for the overall circuit to function. Because embodiments in accordance with the present invention comprise stacked devices, they are similar to many logic circuits that also comprise stacked devices, e.g., NAND and/ or NOR logic gates. Consequently, embodiments in accordance with the present invention match or track changes in operating speed of complex logic more accurately than multiplexers comprising very simple inverters.

It is to be appreciated that embodiments in accordance with the present invention are well suited to selecting among more than the two signals illustrated in FIG. 1, and embodiments comprising more than two selectable signals are to be considered within the scope of the present invention.

Embodiments in accordance with the present invention are thus shown to offer significant and highly beneficial improvements in tracking timing changes of other circuits and in static power (leakage current) consumption in comparison to the conventional art.

Figure 2:
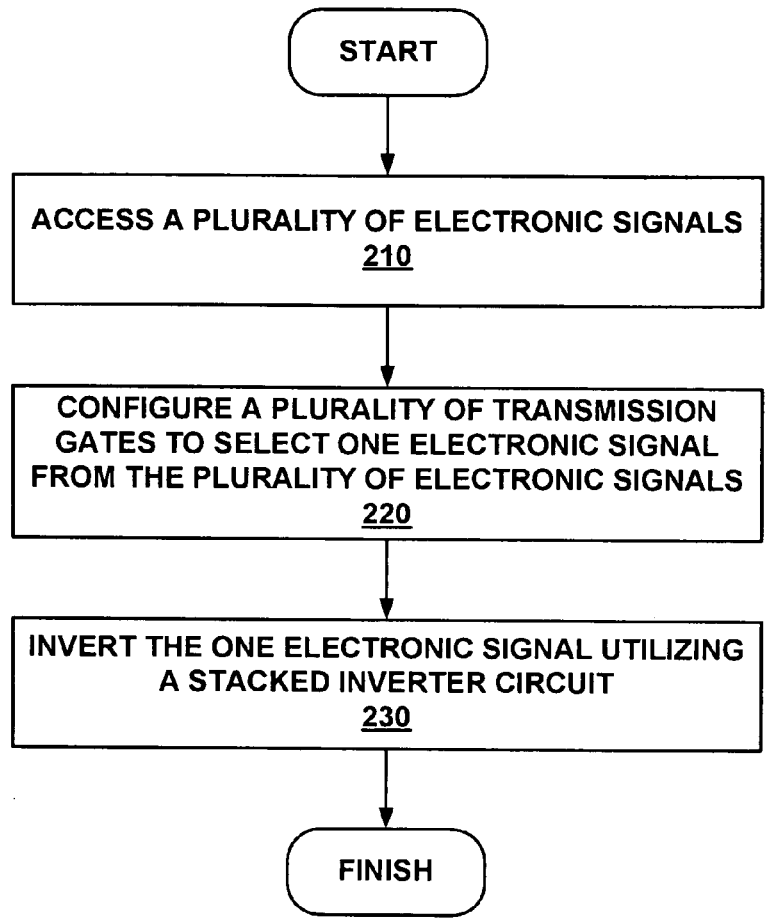
FIG. 2 illustrates a flow chart for a method 200 of selecting one electronic signal from a plurality of electronic signals, in accordance with embodiments of the present invention.

FIG. 2 illustrates a flow chart for a method 200 of selecting one electronic signal from a plurality of electronic signals, in accordance with embodiments of the present invention. In 210, the plurality of electronic signals is accessed. For example, referring to FIG. 1, the plurality of electronic signals is accessed at transmission gates 121 and 122.

In 220, a plurality of transmission gates is configured to select one electronic signal from the plurality of electronic signals. For example, referring to FIG. 1, a zero value in latch 130 will cause transmission gate 121 to pass signal A 125, while causing transmission gate 122 not to pass any signals. Consequently, transmission gate structure 120 will select signal A 125 corresponding to a zero value in latch 130.

In 230, the one electronic signal is inverted utilizing a stacked inverter circuit, for example stacked inverter circuit 110 of FIG. 1.

Embodiments in accordance with the present invention, power efficient multiplexer, are thus described. While the present invention has been described in particular embodiments, it should be appreciated that the present invention should not be construed as limited by such embodiments, but rather construed according to the below claims.

What is claimed is:

1. A power efficient multiplexer comprising:
   a transmission gate structure for selectively passing one of a plurality of input signals; and
   a stacked inverter circuit for inverting said one of a plurality of input signals at an output node, wherein said one of a plurality of input signals controls all devices of said stacked inverter circuit.

2. The power efficient multiplexer of claim 1 wherein said transmission gate structure comprises two transmission gates.

3. The power efficient multiplexer of claim 2 wherein one bit and the complement of said one bit determine said passing of one of a plurality of input signals.

4. The power efficient multiplexer of claim 2 wherein said stacked inverter circuit comprises:
   a first plurality of devices of a first type coupled in series;
   a second plurality of devices of a second type coupled in series, said second type opposite to said first type; and
   wherein said first and said second pluralities of devices are coupled in series.

5. The power efficient multiplexer of claim 4 wherein said first plurality of devices comprises two devices.

6. The power efficient multiplexer of claim 4 wherein said second plurality of devices of said second type comprises three n-type devices.

7. The power efficient multiplexer of claim 4 wherein said stacked inverter circuit is characterized in having a greater switching time duration than an inversion performed by an inverter comprising only two active devices.

8. The power efficient multiplexer of claim 4 wherein said stacked inverter circuit is characterized in having less leakage current than an inverter comprising only two active devices.

9. A method of selecting one electronic signal from a plurality of electronic signals comprising:
   accessing said plurality of electronic signals;
   configuring a plurality of transmission gates to select one electronic signal from said plurality of electronic signals; and
   inverting said one electronic signal utilizing a stacked inverter circuit, wherein said one electronic signal controls all devices of said stacked inverter circuit.

10. The method of claim 9 wherein said configuring comprises coupling a bit value and the complement of said bit value to said plurality of transmission gates.

11. The method of claim 9 wherein said stacked inverter circuit comprises at least two p-type devices coupled in series with at least two n-type devices.

12. The method of claim 11 wherein said stacked inverter circuit is characterized in having a greater switching time duration than an inversion performed by an inverter comprising only two active devices.

13. The method of claim 11 wherein said stacked inverter circuit is characterized in having less leakage current than an inverter comprising only two active devices.

14. The method of claim 9 wherein said stacked inverter circuit comprises:
   a first plurality of devices of a first type coupled in series;
   a second plurality of devices of a second type coupled in series, wherein said second type is opposite to said first type; and
   wherein said first and said second pluralities of devices are coupled in series and comprise at least five active devices.

15. An electronic circuit comprising:
   a stacked inverter circuit comprising:
      at least two devices of a first type coupled in series, coupled in series to
      at least two devices of a second type coupled in series, wherein said second type is opposite to said first type;
      wherein gates of each device comprising said stacked inverter circuit are coupled together;
   a first conductance terminal of a first transmission gate coupled to a first electronic signal;
   a first conductance terminal of a second transmission gate coupled to a second electronic signal;
   second conductance terminals of said first and second transmission gates coupled to an input of said stacked inverter circuit;
   wherein a first control terminal of a semiconductor type of said first transmission gate is coupled to a second control terminal of opposite semiconductor type of said second transmission gate; and
   wherein a second control terminal of said opposite semiconductor type of said first transmission gate is coupled to a first control terminal of said semiconductor type of said second transmission gate.

16. The electronic circuit of claim 15 wherein said stacked inverter circuit comprises two p-type devices.

17. The electronic circuit of claim 15 wherein said stacked inverter circuit comprises three n-type devices.

18. The electronic circuit of claim 15 further comprising a latch circuit, wherein a bit value of said latch circuit is coupled to said first control terminal of a semiconductor type of said first transmission gate, and the complement of said bit value is coupled to said second control terminal of said opposite semiconductor type of said first transmission gate.

* * * * *